(12) United States Patent
Noto et al.

(10) Patent No.: US 7,276,939 B2
(45) Date of Patent: Oct. 2, 2007

(54) SEMICONDUCTOR INTEGRATED CIRCUIT (75) Inventors: Takayuki Noto, Tachikawa (JP);
Tomoru Sato, Fuchu (JP); Hiroyuki Yamauchi, Higashimurayama (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/542,727

(22) PCT Filed: Jan. 20, 2003

(86) PCT No.: PCT/JP03/00403

§ 371 (c)(1),
(2), (4) Date: Jul. 20, 2005

(87) PCT Pub. No.: WO2004/066499

PCT Pub. Date: Aug. 5, 2004

(65) Prior Publication Data
US 2006/0061395 A1 Mar. 23, 2006

(51) Int. Cl.
H03K 19/0175 (2006.01)

(52) U.S. Cl. .................. 326/83; 326/30; 326/81; 326/56; 327/108

(58) Field of Classification Search ............ 326/56–58; 327/108
See application file for complete search history.

(56) References Cited

U.S. PATENT DOCUMENTS

| | | | | |
|---|---|---|---|---|
| 4,855,623 A | * | 8/1989 | Flaherty | 326/87 |
| 5,952,850 A | * | 9/1999 | Hojo et al. | 326/83 |
| 6,107,830 A | * | 8/2000 | Okumura | 326/58 |
| 6,154,056 A | * | 11/2000 | Casper | 326/58 |
| 6,340,898 B1 | * | 1/2002 | Haubursin et al. | 326/49 |
| 6,448,812 B1 | * | 9/2002 | Bacigalupo | 326/83 |
| 6,567,318 B2 | * | 5/2003 | Bedarida et al. | 365/189.05 |

FOREIGN PATENT DOCUMENTS

| | | |
|---|---|---|
| JP | 2-235435 | 9/1990 |
| JP | 3-62723 | 3/1991 |
| JP | 3-232020 | 10/1991 |
| JP | 5-14169 | 1/1993 |

OTHER PUBLICATIONS

Takayuki Kawahara et al., "Low-Power Chip Interconnection by Dynamic Termination", IEEE J. of Solid-State Circuits, vol. 30, No. 9, Sep. 30, 1995, pp. 1030 to 1034, Figs. 2, 3.

* cited by examiner

Primary Examiner—Vibol Tan
(74) Attorney, Agent, or Firm—Antonelli, Terry, Stout & Kraus, LLP.

(57) ABSTRACT

A semiconductor integrated circuit includes an input circuit for taking in signals and an output circuit for outputting signals. The input circuit is so set that the input impedance during input signal transition is lower than the input impedance on other occasions than input signal transition. The output circuit is so set that the driving force during the second half of signal transition is lower than the driving force during the first half of transition. Such setting that the input impedance during input signal transition is lower than the input impedance on other occasions than input signal transition reduces reflected waves during input signal transition. Such setting that the driving force during the second half of signal transition is lower than the driving force during the first half of transition suppresses production of reflected waves during the second half of signal transition. Thus, the necessity for external components, such as damping resistors and terminator resistors, for impedance matching is obviated.

7 Claims, 10 Drawing Sheets

SEMICONDUCTOR INTEGRATED CIRCUIT

DESCRIPTION

This application is a 371 of PCT/JP03/00403 Jan. 20, 2003.

1. Technical Field

The present invention relates to a semiconductor integrated circuit, and an improvement technique for an input circuit and an output circuit included therein.

2. Background Art

In a signal transmission line of over 100 MHz, in general, there is reflection due to mismatching between output buffer and wiring impedance. Therefore, if the driving force of the output buffer is only enhanced, ringing due to reflection can occur, and malfunctions such as inversion of a logical value can be caused. To cope with this, consideration has been given to the number of installed damping resistors and methods for installation so that the impedance of an output buffer and that of wiring can be matched with each other on board.

Semiconductor integrated circuits are provided with an input buffer circuit for taking external signals into a chip and an output buffer circuit for outputting signals to the outside of the chip. Examples of documents describing buffer circuits include Japanese Unexamined Patent Publication No. Hei 5(1993)-14169, Japanese Unexamined Patent Publication No. Hei 3(1991)-62723, and Japanese Unexamined Patent Publication No. Hei 3(1991)-242020.

Japanese Unexamined Patent Publication No. Hei 5(1993)-14169 discloses a technique for making potential fluctuation in a power wire or a grounding wire, which can occur in conjunction of the operation of a buffer circuit, less prone to occur by the following means: the output potential of a plurality of PMOS transistors for driving, different in current drive capability, and the output potential of a drive circuit portion, formed by connecting a plurality of PMOS transistors for driving, different in current drive capability, and a plurality of NMOS transistors, different in current drive capability, in CMOS inverter constitution, are sensed by two inverters for sensing, different in logic threshold voltage; a MOS transistor for driving is selected by the output signals from the individual inverters for sensing and an external input signal; and, when the output potential of the drive circuit portion is switched, the following procedure is taken: during the first half of the switching period, a load is driven with a MOS transistor higher in current drive capability, and during the second half of the switching period, the load is driven with a MOS transistor lower in current drive capability.

Japanese Unexamined Patent Publication No. Hei 3(1991)-62723 discloses a technique for suppressing the occurrences of overshoot and undershoot by the following means: the characteristic impedance of a signal transmission line is driven according to an input signal; and further the following items are provided: a first output circuit having an output impedance equal to the characteristic impedance of the signal transmission line and comprising first and second transistors complementarily connected in pair; a second output circuit connected at output end to the signal transmission line and comprising third and fourth transistors complementarily connected in pair; and a control circuit that brings the second output circuit into active state only when the input signal is changed.

Japanese Unexamined Patent Publication No. Hei 3(1991)-242020 discloses a technique for reducing overshoot and undershoot at an output point by the following means: an output buffer comprises a first transistor and a second transistor connected in series between two voltage sources different in voltage level and having an output impedance equal to the characteristic impedance of a signal transmission line, a control unit that generates a control signal for relatively switching between the first transistor and the second transistor according to an input signal, and an output node provided between the first transistor and the second transistor; and the output buffer is provided with the following items: a third transistor connected in parallel with the first transistor and the second transistor, respectively; a first auxiliary control unit that turns on the third transistor at the same time as the first transistor, and turns off the third transistor immediately before the output node voltage reaches the high voltage level by a first clocking means that defines the time from when the third transistor is turned on to when it is turned off and a first voltage detecting means; and a second auxiliary control unit that turns on the fourth transistor at the same time as the second transistor, and turns off the fourth transistor immediately before the output node voltage reaches a constant voltage level by a second clocking means that defines the time from when the fourth transistor is turned on to when it is turned off and a second voltage detecting means.

To transmit signals at high speed, the driving force of an output buffer must be enhanced to accelerate a wiring load. However, if the driving force of the output buffer is enhanced and a mismatch results between its impedance and that of the wiring, a malfunction due to signal reflection occurs. For this reason, if the driving force of the output buffer is enhanced, board design involving insertion of damping resistors is required for impedance matching.

On the input side as well, addition of damping resistors and terminator resistors and other like means are required for impedance matching. In board designing, consideration must be given to the number and disposition of damping resistors with respect to each board. The present inventors found that this increased the time required for board designing, and it led to increase in the number of parts on board and increase in the number of parts. The above-mentioned related arts do not give consideration to the constitution of signal input circuits.

An object of the present invention is to provide a technology for reducing reflection in transmission lines through simple constitution.

This and other objects and novel features of the present invention will be apparent from the following description and the accompanying drawings.

DISCLOSURE OF THE INVENTION

The following is a brief description of the gist of the representative elements of the invention laid open in this application.

The present invention is a semiconductor integrated circuit including an input circuit for taking in signals and an output circuit for outputting signals. The input circuit is so set that the input impedance during input signal transition is lower than the input impedance on other occasions than input signal transition. The output circuit is so set that the driving force during the first half of signal transition is higher than the driving force during the second half of transition.

According to the above means, the input circuit is so set that the input impedance during input signal transition is lower than the input impedance on other occasions than input signal transition. Reflected waves are thereby reduced during input signal transition. Further, the output circuit is so set that the driving force during the second half of signal transition is lower than the driving force during the first half of transition. Production of reflected waves can be thereby suppressed. As the result of the above-mentioned reduction of reflected waves, the necessity for external components, such as damping resistors and terminator resistors, for impedance matching is obviated.

The input circuit and the output circuit can be connected in common to pads through which signals can be inputted and outputted.

When a semiconductor integrated circuit is so constructed that it includes an input pad and an input circuit for taking in external signals through the input pad, the input circuit is provided with a dynamic terminator resistor circuit is provided. The dynamic terminator resistor circuit can be adjusted so that the input impedance during input signal transition is lower than the input impedance on other occasions than input signal transition.

The dynamic terminator resistor circuit can be so constructed that it includes: a first logic circuit for inverting the logic of a signal transmitted through the input pad; a second logic circuit for inverting the logic of the output signal of the first logic circuit; and a resister that can connect the input terminal of the first logic circuit with the output terminal of the second logic circuit.

The dynamic terminator resistor circuit can be so constructed that it includes: a first logic circuit for inverting the logic of a signal transmitted through the input pad; a second logic circuit for inverting the logic of the output signal of the first logic circuit; a resister that can connect the input terminal of the first logic circuit with the output terminal of the second logic circuit; and a third logic circuit for transmitting the output signal of the first logic circuit to an internal circuit.

A switch circuit can be provided which can control the involvement of the resister with circuit operation.

The dynamic terminator resistor circuit can be so constructed that it includes: a first logic circuit for inverting the logic of a signal transmitted through the input pad; a second logic circuit for inverting the logic of the output signal of the first logic circuit; a plurality of resisters that can connect the input terminal of the first logic circuit and the output terminal of the second logic circuit; and a switch circuit for selectively getting a plurality of the resisters involved with circuit operation.

When a semiconductor integrated circuit is so constructed that it includes an internal circuit and an output circuit that can externally output the output signal of the internal circuit, the output circuit can be provided with the following items: a first output circuit that can drive an external load during the first half of transition of a signal to be outputted, based on the output signal of the internal circuit; and a second output circuit whose driving force is set lower as compared with the first output circuit and which can drive the external load.

A level monitor circuit can be included for selectively getting the first output control circuit or the second output circuit involved with circuit operation according to the voltage level of the external load.

When the second output circuit includes a series connection circuit of an n-channel transistor disposed on the higher-potential power supply side and a p-channel transistor disposed on the lower-potential power supply side, it performs the following: it connects the series connection node between the n-channel transistor and the p-channel transistor to the output node of the first output circuit.

When a semiconductor integrated circuit is so constructed that it includes an input portion and an output portion respectively constructed as follows: the input portion is so set that the input impedance during input signal transition is lower than the input impedance on other occasions than input signal transition, and the output portion is so set that the driving force during the second half of signal transition is lower than the driving force during the first half of transition, the following means is taken: the output portion includes a first output circuit that can drive an external load based on the output signal of the internal circuit during the first half of transition of a signal to be outputted, and a second output circuit whose driving force is set lower as compared with the first output circuit and which can drive the external load; the second output circuit includes a series connection circuit of an n-channel transistor disposed on the higher-potential power supply side and a p-channel transistor disposed on the lower-potential power supply side; the series connection node between the n-channel transistor and the p-channel transistor is connected in common to the input/output pad together with the output node of the first output circuit; and the series connection circuit is also used as part of the input portion.

BEST MODE FOR CARRYING OUT THE INVENTION

Figure 12:
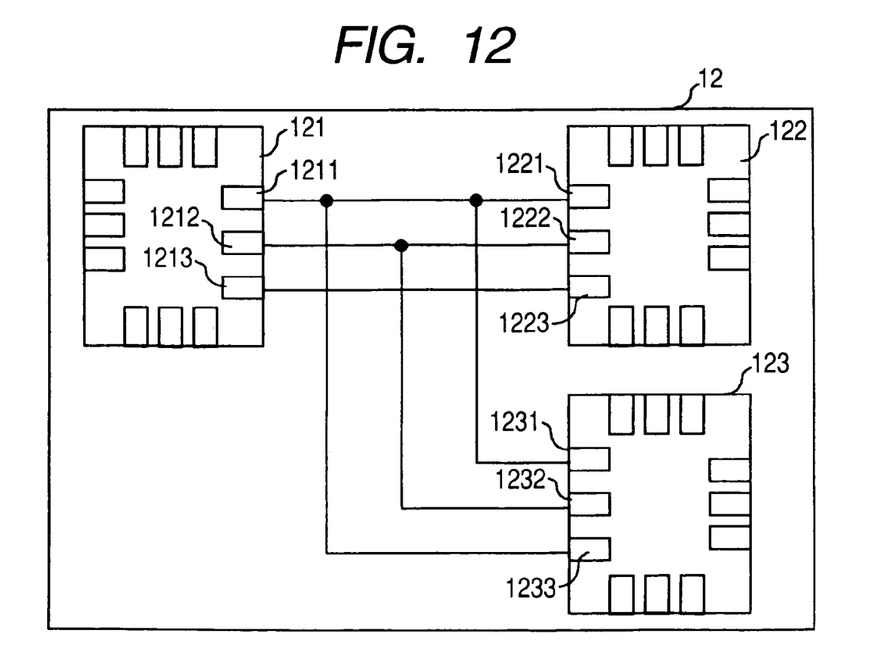
FIG. 12 is a drawing explaining the constitution of a board system mounted with the semiconductor integrated circuit.

FIG. 12 illustrates a board system mounted with a semiconductor integrated circuit according to the present invention.

The board system 12 illustrated in FIG. 12 comprises three semiconductor integrated circuits 121, 122, and 123 mounted on a single board; however, the present invention is not specially limited to this constitution. The semiconductor integrated circuits 121, 122, and 123 are respectively formed over one semiconductor substrate, such as a single crystal silicon substrate, by publicly known semiconductor integrated circuit manufacturing techniques. They are connected with one another through printed wiring formed on the board so that signals can be communicated between them.

The semiconductor integrated circuit 121 includes an input circuit 1211 for taking in external signals, an output circuit 1212 for externally outputting signals, and an input/output circuit 1213 for enabling the communication of signals between it and the outside; however, the present invention is not specially limited to this constitution.

The semiconductor integrated circuit 122 includes an output circuit 1221 for externally outputting signals, an input circuit 1222 for taking in external signals, and an input/output circuit 1223 for enabling the communication of signals between it and the outside; however, the present invention is not specially limited to this constitution.

The semiconductor integrated circuit 123 includes an output circuit 1231 for externally outputting signals, an input circuit 1232 for taking in external signals, and an input/output circuit 1233 for enabling the communication of signals between it and the outside; however, the present invention is not specially limited to this constitution.

The semiconductor integrated circuits 121, 122, and 123 are designed to suppress reflection in a transmission line. For this reason, the necessity for external damping resistors or terminator resistors is obviated.

Description will be given to an example of the constitution of the input circuits 1211, 1222, and 1232 included in the semiconductor integrated circuits 121, 122, and 123.

Figure 1:
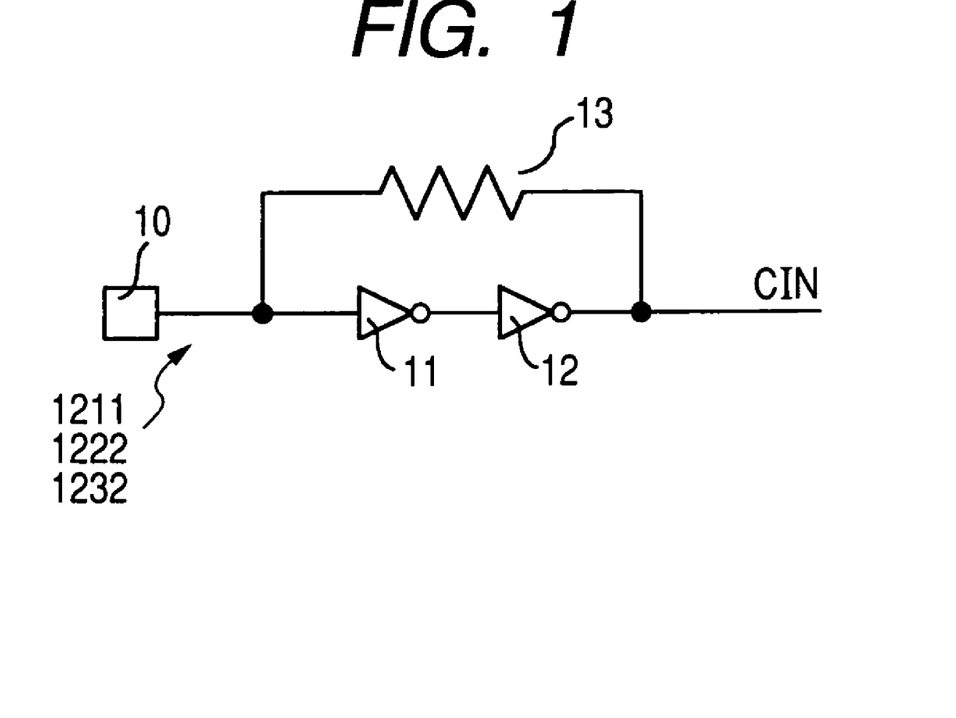
FIG. 1 is a circuit diagram illustrating an example of the constitution of the input circuit included in a semiconductor integrated circuit according to the present invention.

FIG. 1 illustrates an example of the constitution of the input circuits 1211, 1222, and 1232.

As illustrated in FIG. 1, the input circuits 1211, 1222, and 1232 respectively include: a first inverter 11 that inverts the logic of a signal taken in through an input pad 10; a second inverter 12 that inverts the logic of a signal outputted from the first inverter 11; and a resister 13 that connects the input terminal of the first inverter 11 and the output terminal of the second inverter 12. The output signal of the second inverter 12 is transmitted to an internal circuit, not shown. The value of the resister 13 is so set that it is substantially equal to the resistance value of the printed wiring in the board system 12 illustrated in FIG. 12.

The logic at the input terminal of the first inverter 11 and the logic at the output terminal of the second inverter 12 are equal to each other until the time immediately before an input signal, taken in through the input pad 10, is caused to transition. It will be assumed that the logic at the input terminal of the first inverter 11 and the logic at the output terminal of the second inverter 12 are LOW. Consideration will be given to a case where, in this state, an input signal taken in through the input pad 10 is caused to transition from low level to high level. When the input signal taken in through the input pad 10 is caused to transition from low level to high level, a delay develops: the timing with which the output terminal of the second inverter 12 is caused to transition from low level to high level is delayed because of signal delays in the first and second inverters 11 and 12. When the input signal at the input pad 10 is caused to transition from low level to high level, the output terminal of the second inverter 12 is kept at low level because of the above-mentioned delay. In this case, the impedance as viewed from the input pad 10 is substantially equal to the parallel combined resistance value of the input impedance of the first inverter 11 and the resister 13. At this time, therefore, the impedance as viewed from the input pad 10 is substantially equal to the resistance value of the printed wiring in the board system 12 illustrated in FIG. 12, and thus the impedance is matched. When the output terminal of the second inverter 12 is thereafter caused to transition from low level to high level, the logic at the input terminal of the first inverter 11 and that at the output terminal of the second inverter 12 become equal to each other. Therefore, the impedance as viewed from the input pad 10 is substantially equal to the input impedance of the first inverter 11 in high impedance state. When an input signal taken in through the input pad is caused to transition from high level to low level as well, the resister 13 is caused to function in the process of the transition. Therefore, the same action and effect are obtained as in cases where an input signal taken in through the input pad is caused to transition from low level to high level.

As mentioned above, in input signal transition, the input impedance is made substantially equal to the resistance value of the printed wiring in the board system 12 illustrated in FIG. 12, and the impedance is thereby matched. Therefore, reflected waves resulting from a signal, outputted to a transmission line, being reflected in an input circuit are reduced. On other occasions than input signal transition, the input impedance is increased, and the consumption of direct current is thereby suppressed. Since the reflected waves are suppressed, the necessity for damping resistors or terminator resistors is obviated.

Figure 2:
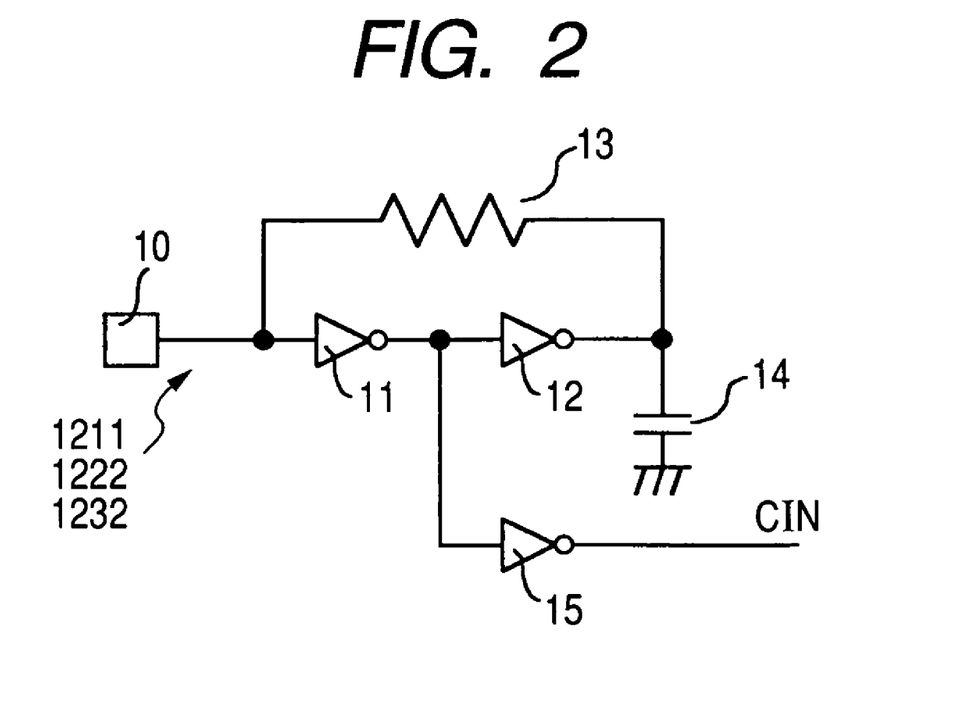
FIG. 2 is a circuit diagram illustrating another example of the constitution of the input circuit.

FIG. 2 illustrates another example of the constitution of the input circuits 1211, 1222, and 1232. A big difference of the constitution illustrated in FIG. 2 from that illustrated in FIG. 1 is that: an inverter 15 is provided for inverting the logic of the output signal of the inverter 11, and signal CIN is transmitted to an internal circuit through the inverter 15. With this constitution, even if a parasitic capacitance 14 exists on the side of the output terminal of the inverter 12, it is completely separated by the presence of the inverters 12 and 15. Therefore, the internal circuit is not influenced by the parasitic capacitance 14.

Figure 3:
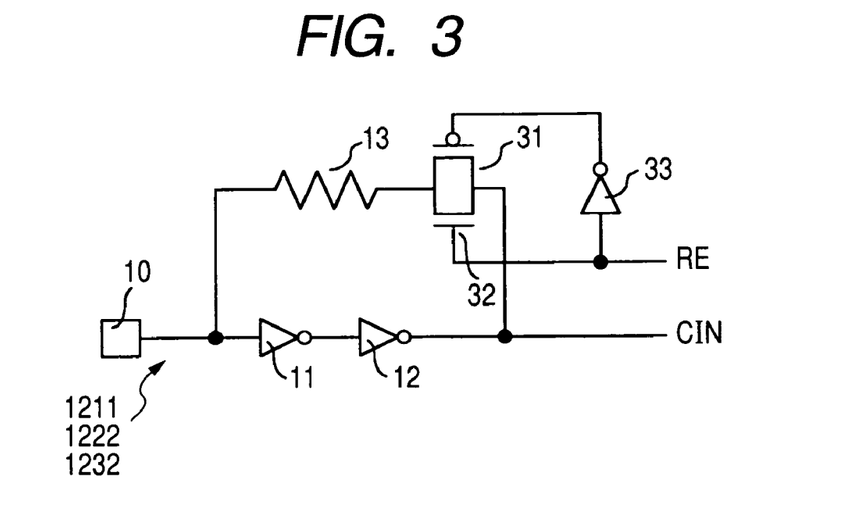
FIG. 3 is a circuit diagram illustrating another example of the constitution of the input circuit.

FIG. 3 illustrates another example of the constitution of the input circuits 1211, 1222, and 1232.

A big difference of the constitution illustrated in FIG. 3 from that illustrated in FIG. 1 is that: a CMOS transfer gate, formed by connecting a p-channel MOS transistor 31 and an n-channel MOS transistor 32 in parallel, is placed between the resister 13 and the output terminal of the second inverter 12. A control signal from a dynamic termination control terminal RE is transmitted to the gate electrode of the n-channel MOS transistor 32. A control signal from the dynamic termination control terminal RE is also transmitted to the gate electrode of the p-channel MOS transistor 31 through an inverter 33. When a dynamic termination control signal from the dynamic termination control terminal RE is at high level, continuity is established between the p-channel MOS transistor 31 and the n-channel MOS transistor 32. As a result, one end of the resister 13 is connected to the output terminal of the second inverter 12. When a dynamic termination control signal from the dynamic termination control terminal RE is at low level, continuity ceases between the p-channel MOS transistor 31 and the n-channel MOS transistor 32. As a result, the involvement of the resister 13 with circuit operation is removed. When the dynamic termination control terminal RE is constituted as an external terminal, dynamic termination control signals can be supplied from outside the chip.

With the constitution illustrated in FIG. 3, as mentioned above, it can be selected by a control signal from the dynamic termination control terminal RE whether to get the resister 13 involved with circuit operation; therefore, the resister 13 can be got involved with circuit operation as the need arises.

Figure 4:
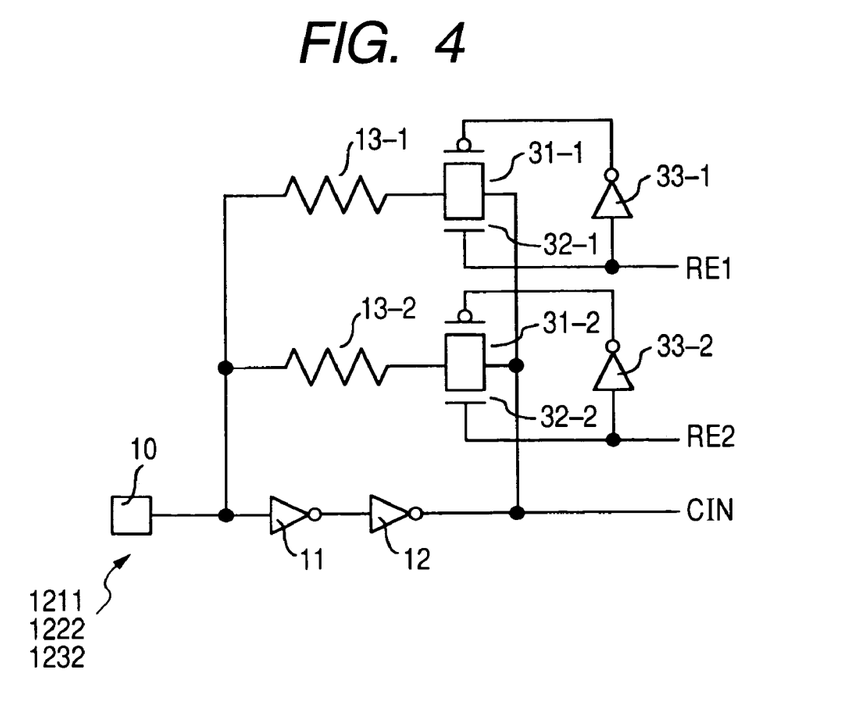
FIG. 4 is a circuit diagram illustrating another example of the constitution of the input circuit.

FIG. 4 illustrates another example of the constitution of the input circuits 1211, 1222, and 1232.

A big difference of the constitution illustrated in FIG. 4 from that illustrated in FIG. 1 is that: resisters 13-1 and 13-2 are provided; a CMOS transfer gate, formed by connecting a p-channel MOS transistor 31-1 and an n-channel MOS transistor 32-1 in parallel, is placed between the resister 13-1 and the output terminal of the second inverter 12; and a CMOS transfer gate, formed by connecting a p-channel MOS transistor 31-2 and an n-channel MOS transistor 32-2 in parallel, is placed between the resister 13-2 and the output terminal of the second inverter 12.

A control signal from a dynamic termination control terminal RE1 is transmitted to the gate electrode of the n-channel MOS transistor 32-1. A control signal from the dynamic termination control terminal RE is also transmitted to the gate electrode of the p-channel MOS transistor 31-1 through an inverter 33-1. A control signal from a dynamic termination control terminal RE2 is transmitted to the gate electrode of the n-channel MOS transistor 32-2. A control signal from the dynamic termination control terminal RE2 is also transmitted to the gate electrode of the p-channel MOS transistor 31-2 through an inverter 33-2. The values of the resister 13-1 and the resister 13-2 are set to values close to the resistance of the wiring on board in the board system 12. For example, when the resistance of the wiring on board is 150Ω, the value of the resister 31-1 is set to 100Ω, and the value of the resister 31-2 is set to 200Ω. The resister 13-1 and the resister 13-2 can be selectively got involved with circuit operation by dynamic terminator resistor control signals supplied from the dynamic terminator resistor control terminals RE1 and RE2. Therefore, the resister 13-1 and the resister 13-2 can be selectively got involved with circuit operation according to the environment in the board system.

The dynamic terminator resistor control signals supplied to the dynamic terminator resistor control terminals RE1 and RE2 can be formed with registers that can be set with DIP switches on the board system 12 or a microcomputer.

Figure 5:
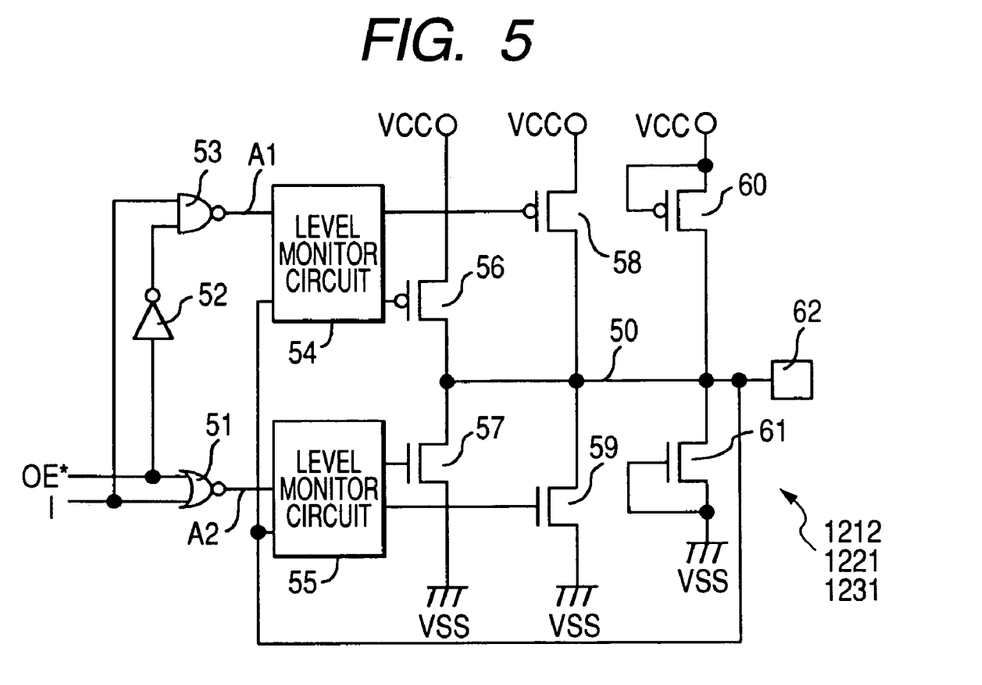
FIG. 5 is a circuit diagram illustrating an example of the constitution of the output circuit included in the semiconductor integrated circuit.

FIG. 5 illustrates an example of the constitution of the output circuits 1212, 1221, and 1231.

A p-channel MOS transistor 56 and an n-channel MOS transistor 57 are connected in series to form a first output circuit; a p-channel MOS transistor 58 and an n-channel MOS transistor 59 are connected in series to form a second output circuit. With respect to the first output circuit (56, 57), the driving force is set to a relatively high value. With respect to the second output circuit (58, 59), the driving force is set to a value lower than that of the first output circuit (56, 57). The setting of driving force can be adjusted through the ratio of the gate width to gate length of the MOS transistors. The source electrodes of the p-channel MOS transistors 56 and 58 are connected to higher-potential power supplies VCC; the source electrodes of the n-channel MOS transistors 57 and 59 are connected to lower-potential power supplies VSS. The drain electrodes of the p-channel MOS transistor 56 and the n-channel MOS transistor 57 and the drain electrodes of the p-channel MOS transistor 58 and the n-channel MOS transistor 59 are connected in common to an output pad 62, and an output node 50 is thereby formed. The output node 50 is connected to an external terminal, not shown.

To prevent the output node 50 from being brought to an undesired voltage level, the following measures are taken: a diode-connected p-channel MOS transistor 60 is placed between the output node 50 and higher-potential power supply VCC, and a diode-connected n-channel MOS transistor 61 is placed between the output node 50 and lower-potential power supply VSS.

The signal level of the output node 50 is transmitted to level monitor circuits 54 and 55. The level monitor circuit 54 controls the operation of the p-channel MOS transistors 56 and 58 based on the signal level of the output node 50. The level monitor circuit 55 controls the operation of the p-channel MOS transistors 57 and 59 based on the signal level of the output node 50. The level monitor circuits 54 and 55 get the MOS transistors 56 and 57, higher in driving force, involved with circuit operation for driving a load until the voltage level of the output node 50 becomes VCC/2; they get the MOS transistors 58 and 59, lower in driving force, involved with circuit operation for driving a load after the voltage level of the output node 50 exceeds VCC/2. However, the present invention is not specially limited to this constitution.

A NOR circuit 51, an inverter 52, and a NAND circuit 53 are provided in the stage preceding the level monitor circuits 54 and 55. The NOR circuit 51 obtains the NOR logic of signal I, outputted from an internal circuit, and output enable signal OE* (* means active LOW). The output signal A2 of the NOR circuit 51 is transmitted to the subsequent level monitor circuit 55. The output enable signal OE* is inverted at the inverter 52, and the NAND circuit 53 obtains the NAND logic of the inverted output signal and signal I, outputted from the internal circuit. The output signal A1 of the NAND circuit 53 is transmitted to the subsequent level monitor circuit 54. Thus, with the output enable signal OE* asserted LOW, signal output can be produced in correspondence with the logic of the signal I.

Figure 6:
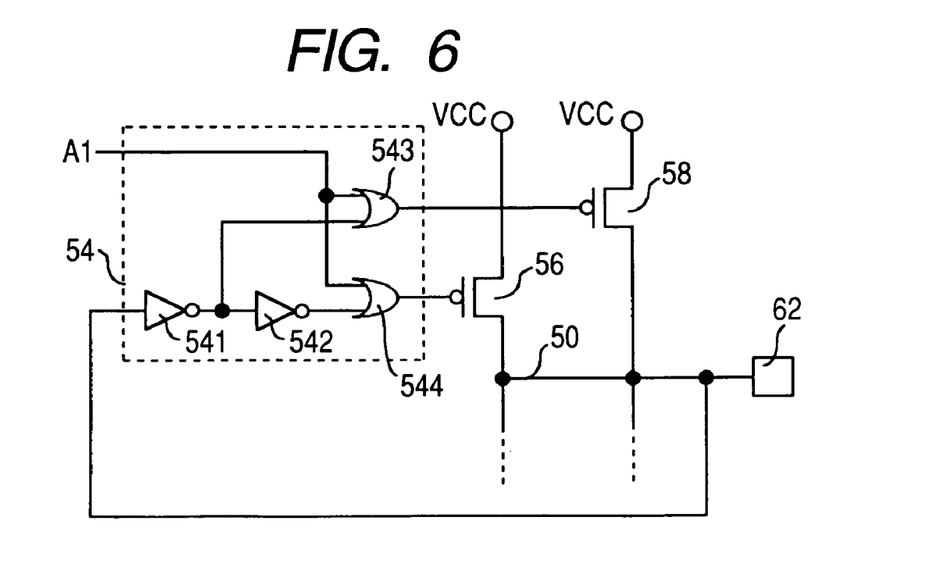
FIG. 6 is a circuit diagram illustrating an example of the constitution of the substantial part of the output circuit.

FIG. 6 illustrates an example of the constitution of the level monitor circuit 54.

As illustrated in FIG. 6, the level monitor circuit 54 is formed by connecting inverters 541 and 542 and OR circuits 543 and 544; however, the present invention is not specially limited to this constitution. The logic of the signal at the output node 50 is inverted at the inverter 541, and the logic of the output signal of the inverter 541 is inverted at the subsequent inverter 542. The OR circuit 543 obtains the OR logic of the output signal A1 of the NAND circuit 53, illustrated in FIG. 5, and the output signal of the inverter 541. The operation of the p-channel MOS transistor 58 is controlled by the output signal of the OR circuit 543. The OR circuit 554 obtains the OR logic of the output signal A1 of the NAND circuit 53 and the output signal of the inverter 552. The operation of the p-channel MOS transistor 56 is controlled by the output signal of the NOR circuit 554. When VCC=3.3V, the logic threshold values of the inverters 541 and 542 are set to (VCC/2) to 2.0V. When the output node 50 is caused to transition from low level to high level with this constitution, the following takes place: during the first half of the transition, the p-channel MOS transistor 56, higher in driving force, is brought into conduction; therefore, the external load is driven with large current. During the second half of the transition, the p-channel MOS transistor 58, lower in driving force, is brought into conduction, in place of the p-channel MOS transistor 56; therefore, the external load is driven with small current.

Figure 7:
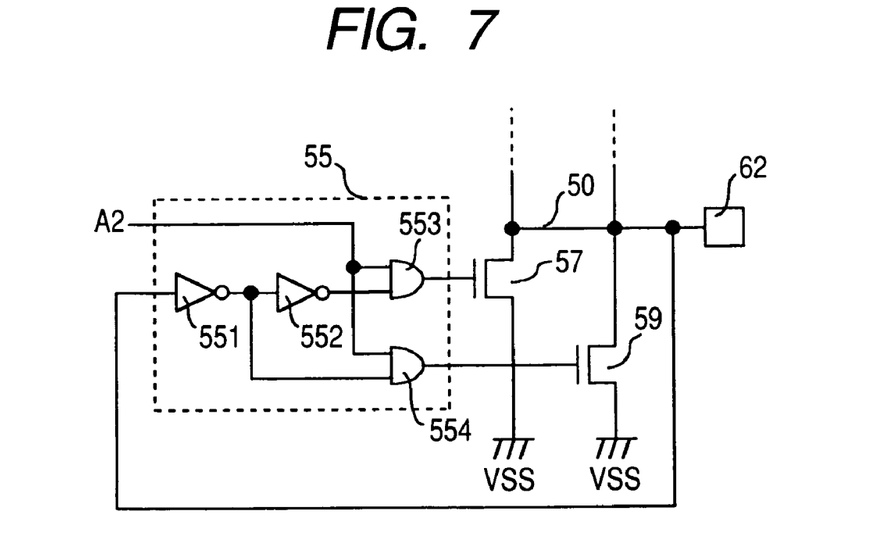
FIG. 7 is a circuit diagram illustrating an example of the constitution of the substantial part of the output circuit.

FIG. 7 illustrates an example of the constitution of the level monitor circuit 55.

As illustrated in FIG. 7, the level monitor circuit 55 is formed by connecting inverters 551 and 552 and AND circuits 553 and 554; however, the present invention is not specially limited to this constitution. The logic of the signal at the output node 50 is inverted at the inverter 551, and the logic of the output signal of the inverter 551 is inverted at the subsequent inverter 552. The AND circuit 553 obtains the AND logic of the output signal A2 of the NOR circuit 51, illustrated in FIG. 5, and the output signal of the inverter 552. The operation of the p-channel MOS transistor 57 is controlled by the output signal of the AND circuit 553. The AND circuit 554 obtains the AND logic of the output signal A1 of the NAND circuit 53 and the output signal of the inverter 551. The operation of the p-channel MOS transistor 59 is controlled by the output signal of the AND circuit 554. When VCC=3.3V, the logic threshold values of the inverters 551 and 552 are set to 0.8 to (VCC/2)V. When the output node 50 is caused to transition from high level to low level with this constitution, the following takes place: during the first half of the transition, the p-channel MOS transistor 57, higher in driving force, is brought into conduction; therefore, the external load is driven with large current. During the second half of the transition, the p-channel MOS transistor 59, lower in driving force, is brought into conduction, in place of the p-channel MOS transistor 57; therefore, the external load is driven with small current. Thus, the reflected waves are reduced.

Figure 13:
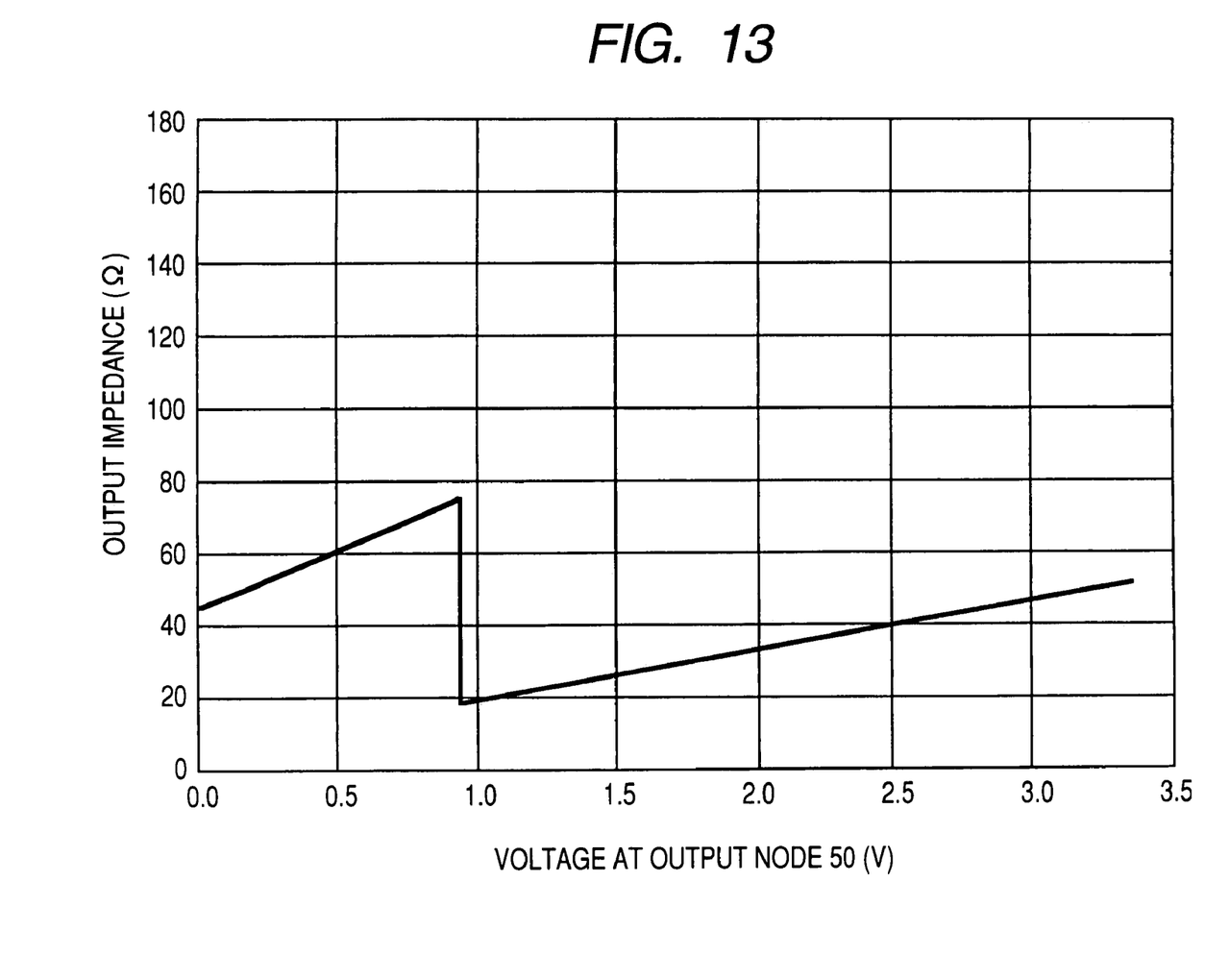
FIG. 13 is a characteristic diagram of the circuit illustrated in FIG. 5.

FIG. 13 illustrates the relation between the voltage at the output node 50 in the circuit illustrated in FIG. 5, and the output impedance. The output impedance is increased in the range of voltage at the output node 50 from 0V to the vicinity of 0.8V. It is steeply lowered when the voltage at the output node 50 is in the vicinity of 0.8V, and then increased again with increase in the voltage at the output node 50. The output impedance is substantially 50Ω when the voltage at the output node 50 is 0V (=VSS) and when it its 3.3V (=VCC). The steep drop in the output impedance is caused by switching between the MOS transistors 56 and 57 and the MOS transistors 58 and 59.

Figure 8:
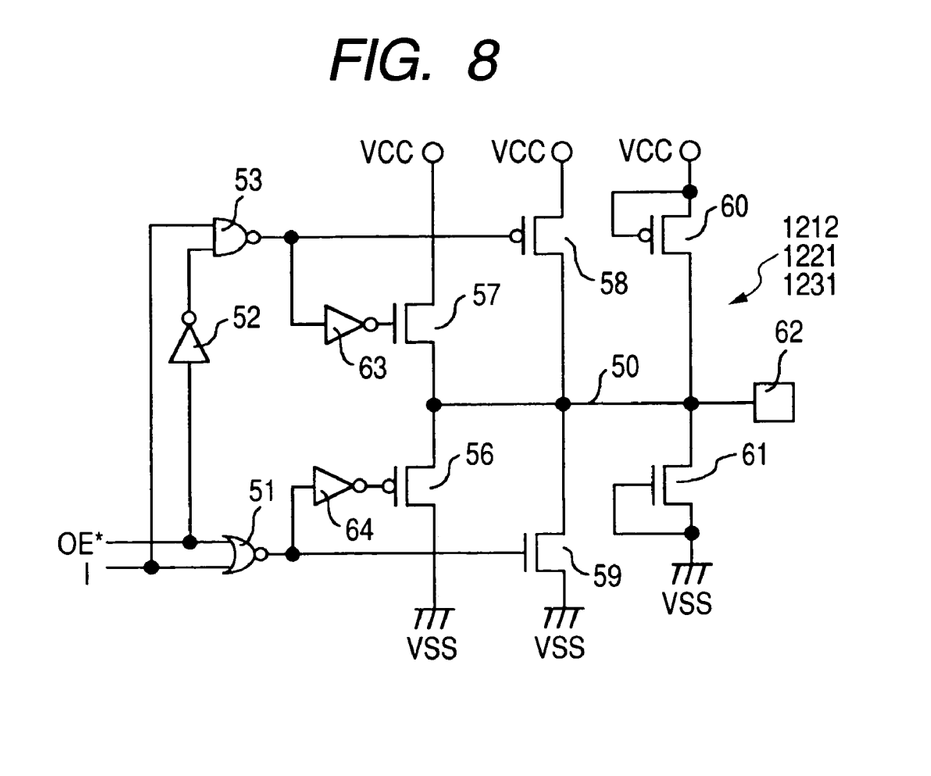
FIG. 8 is a circuit diagram illustrating another example of the constitution of the output circuit.

FIG. 8 illustrates another example of the constitution of the output circuits 1212, 1221, and 1231.

A big difference of the constitution illustrated in FIG. 8 from that illustrated in FIG. 5 is that: an n-channel MOS transistor 57, higher in driving force, is disposed on the higher-potential power supply VCC side and a p-channel MOS transistor 56, higher in driving force, is disposed on the lower-potential power supply VSS side; and inverters 63 and 64 are provided in place of the level monitor circuits 54 and 55. The inverter 63 inverts the logic of the output signal of the NAND circuit 53. The operation of the n-channel MOS transistor 57 is controlled by the output signal of the inverter 63. The inverter 64 inverts the logic of the output signal of the NOR circuit 51. The operation of the p-channel MOS transistor 56 is controlled by the output signal of the inverter 64.

Consideration will be given to a case where, with this constitution, the voltage level at the output node 50 is driven from low level (VSS level) to high level (VCC level). In this case, both the n-channel MOS transistor 57, higher in driving force, and the p-channel MOS transistor 58, lower in driving force, are brought into conduction until the voltage level at the output node 50 changes from the VSS level to the VCC−Vth. (Vth is the threshold value of the MOS transistor 57.) A load is thereby driven. When the voltage level at the output node 50 changes from the VCC level to VCC−Vth, the n-channel MOS transistor 57 in conduction is brought out of conduction. Thereafter, the load is driven by the p-channel MOS transistor 58, lower in driving force.

Consideration will be given to a case where the voltage level at the output node 50 is driven from high level (VCC level) to low level (VSS level). In this case, both the p-channel MOS transistor 56, higher in driving force, and the n-channel MOS transistor 59, lower in driving force, are brought into conduction until the voltage level at the output node 50 changes from the VCC level to VSS+Vth. (Vth is the threshold value of the MOS transistor 56.) A load is thereby driven. When the voltage level at the output node 50 changes from the VCC level to VSS+Vth, the p-channel MOS transistor 56 in conduction is brought out of conduction. Thereafter, the load is driven by the n-channel MOS transistor 59, lower in driving force.

As mentioned above, during the first half of the transition period of the output node 50, a load is driven by the MOS transistors 57 and 56, higher in driving force; during the second half of the transition period of the output node 50, the load is driven by the MOS transistors 58 and 59, lower in driving force. For this reason, the same effect as with the constitution illustrated in FIG. 5 can be obtained. With the constitution illustrated in FIG. 8, the necessity for the level monitor circuits 54 and 55 is obviated; therefore, the number of elements can be reduced as compared with the constitution illustrated in FIG. 5.

Figure 14:
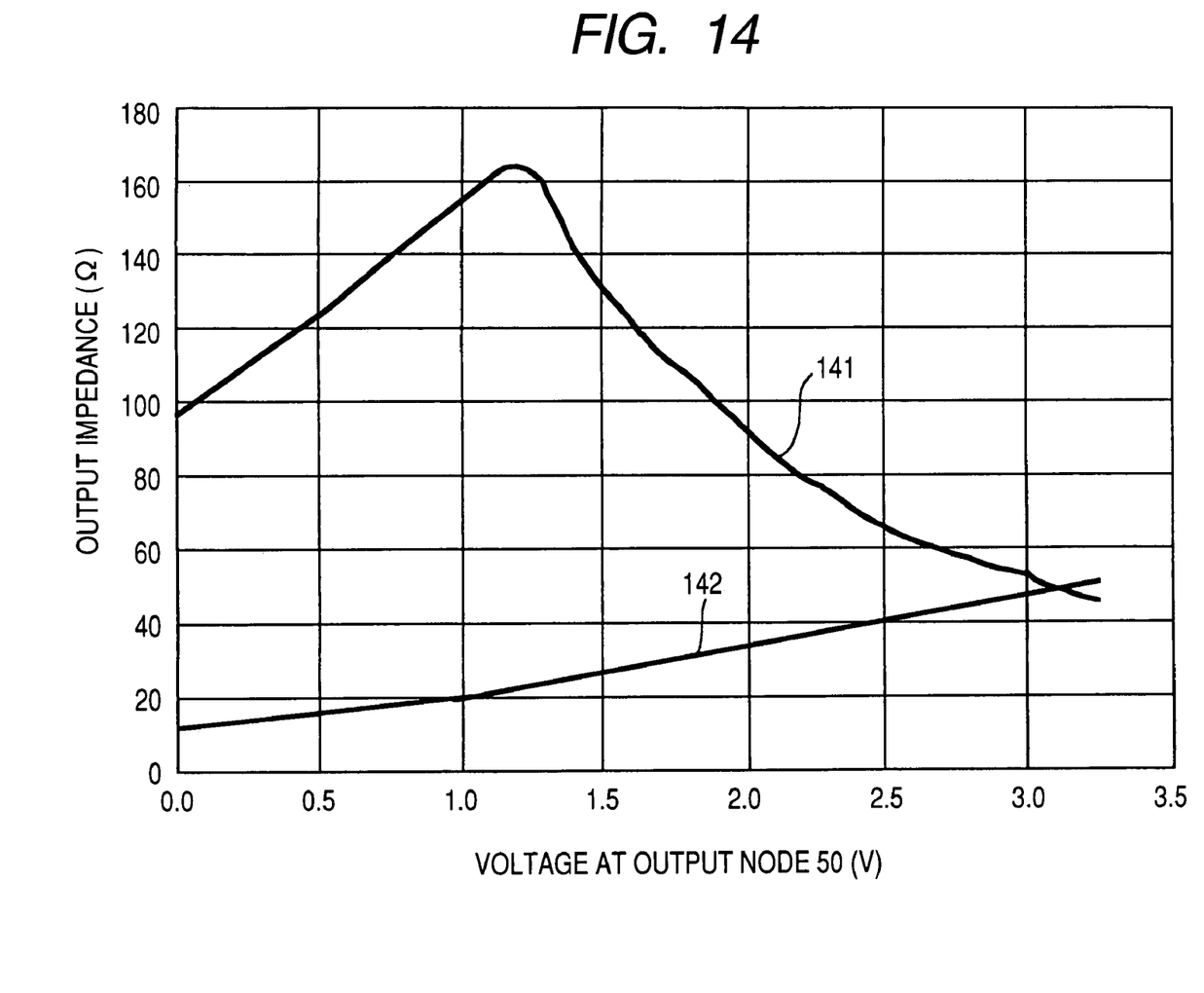
FIG. 14 is a characteristic diagram of the circuit illustrated in FIG. 8.

FIG. 14 illustrates the relation between the potential at the output node 50 in the circuit illustrated in FIG. 8 and the output impedance. In FIG. 14, characteristic curve 141 corresponds to the circuit illustrated in FIG. 8, and characteristic curve 142 corresponds to a circuit in which switching between MOS transistors, different in driving force, is not carried out in driving a load. When switching between MOS transistors, different in driving force, is not carried out, the output impedance is gradually increased with increase in the voltage at the output node 50, as indicated by characteristic curve 142. When switching between MOS transistors, different in driving force, is carried out, the output impedance gently varies with switching of the MOS transistors at the peak.

Figure 9:
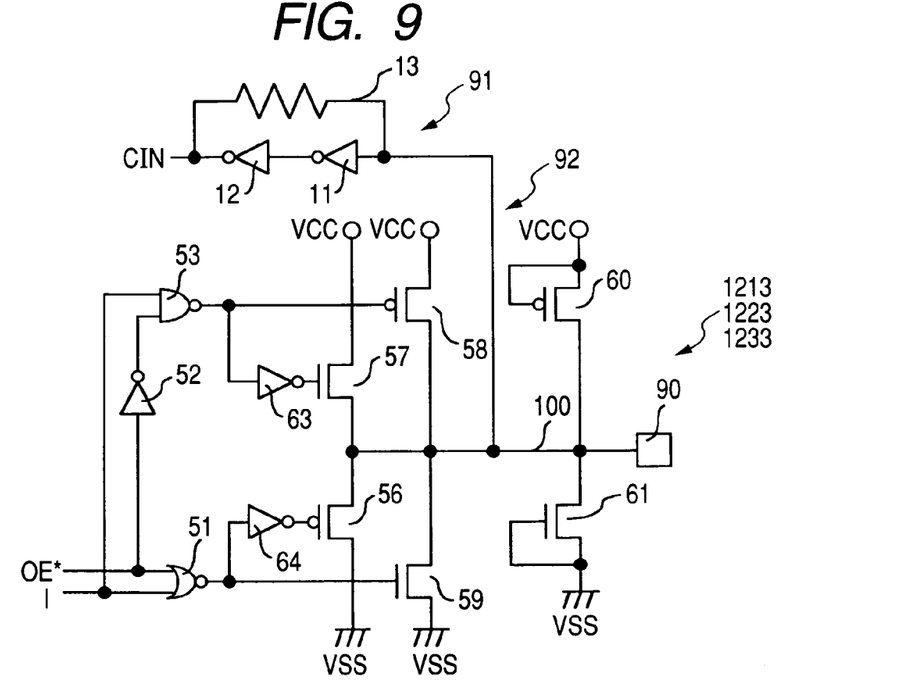
FIG. 9 is a circuit diagram illustrating an example of the constitution of the input/output circuit included in the semiconductor integrated circuit.

FIG. 9 illustrates another example of the constitution of the input/output circuits 1213, 1223, and 1233. The input/output buffers 1213, 1223, and 1233 respectively include: an input portion 91 for taking in external signals through an input/output pad 90 and an input/output node 100; and an output portion 92 for externally outputting signals through the input/output node 100 and the input/output pad 90. The input/output terminal 90 is shared between the input portion 91 and the output portion 92. During a period for which the output enable signal OE* is asserted LOW, signals can be externally outputted through the input/output pad 90. During a period for which the output enable signal OE* is negated HIGH, the output portion 92 is in high-impedance state, and signals can be taken in through the input/output pad 90. For the input portion 91, one of the same constitution as illustrated in FIG. 1 is used, and for the output portion 92, one of the same constitution as illustrated in FIG. 8 is used. Therefore, in the input portion 91, the same action and effect as in the input circuit illustrated in FIG. 1 can be obtained, and in the output portion 92, the same action and effect as in the output circuit illustrated in FIG. 8 can be obtained.

Figure 10:
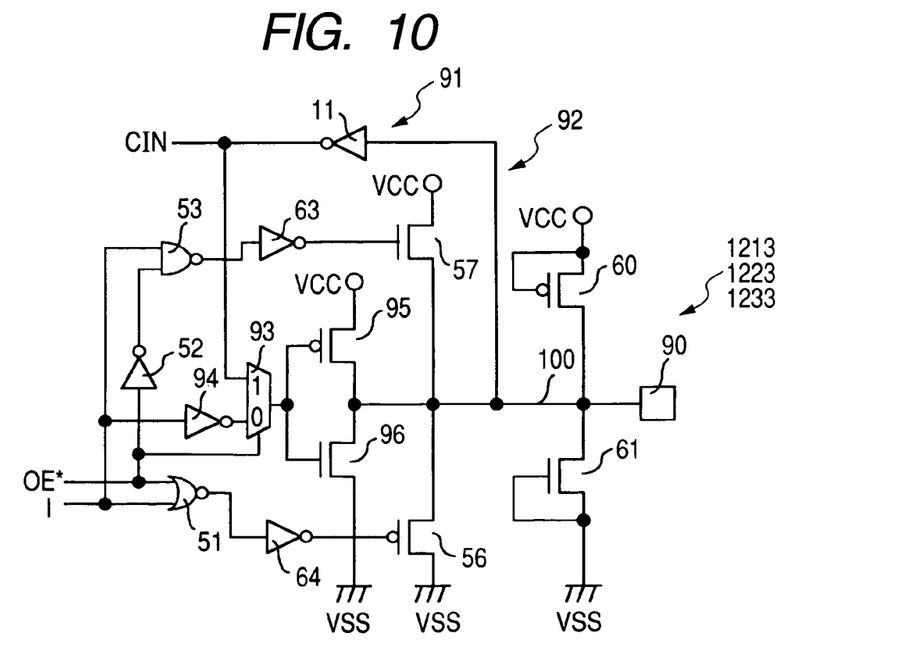
FIG. 10 is a circuit diagram illustrating another example of the constitution of the input/output circuit included in the semiconductor integrated circuit.

FIG. 10 illustrates another example of the constitution of the input/output circuits 1213, 1223, and 1233. A big difference of the input/output circuits 1213, 1223, and 1233, illustrated in FIG. 10, from those illustrated in FIG. 9 is that: the output portion 92 is provided with the dynamic terminator resistor functions of the input portion 91. More specific description will be given. An inverter, formed by connecting a p-channel MOS transistor 95 and an n-channel MOS transistor 96 in series, is provided, and a multiplexer 93 is placed in the stage preceding this inverter. Signal transmission paths are changed by the multiplexer 93, and the inverter (95, 96) is thereby shared between the input portion 91 and the output portion 92. The operation of the multiplexer 93 is controlled by the output enable signal OE*.

When the output enable signal OE* is at low level, the output signal of an inverter 94 is selectively transmitted to the gate electrodes of the MOS transistors 95 and 96 through the multiplexer 93. The inverter 94 is provided for inverting the logic of signal I outputted from an internal circuit. In this state, signal output from the output portion 92 is made possible.

When the output enable signal OE* is at high level, the output signal CIN of the inverter 11 is selectively transmitted to the MOS transistors 95 and 96 through the multiplexer 93. The output signals of the MOS transistors 95 and 96 are transmitted to the inverter 11 through the input/output node 100. At this time, the functions of the resister 13 in FIG. 9 are carried out by the output resistance of the inverter (95, 96) and the wiring resistance of the input/output node 100. At this time, the synthesized value of the on-resistance of the MOS transistors 95 and 96 and the wiring resistance of the input/output node 100 is so set that it is substantially equal to the resistance value of the printed wiring in the board system 12.

During a period for which the output enable signal OE* is negated HIGH with the above-mentioned constitution, the following takes place: the logic at the input terminal of the inverter 11 and the logic at the output terminal of the inverter (95, 96) are equal to each other until the time immediately before an input signal, taken in through the input/output pad 90, is caused to transition. It will be assumed that the logic at the input terminal of the inverter 11 and the logic at the output terminal of the inverter are HIGH. Consideration will be given to a case where, in this state, an input signal taken in through the input/output pad 90 is caused to transition from low level to high level. When the input signal taken in through the input/output pad 90 is caused to transition from low level to high level, a delay develops: the timing with which the output node of the inverter (95, 96) is caused to transition from low level to high level is delayed because of signal delays in the inverter 11 and the inverter (95, 96). When the input signal at the input output pad 90 is caused to transition from low level to high level, the output terminal of the inverter (95, 96) is kept at low level because of the above-mentioned signal delay. In this case, the impedance as viewed from the input/output pad 90 is determined by the synthesized value of the on-resistance of the n-channel MOS transistor 96 and the wiring resistance value of the input/output node 100. The synthesized value of the on-resistance of the n-channel MOS transistor 96 and the wiring resistance value of the input/output node 100 is so set that it is substantially equal to the resistance value of the printed wiring in the board system 12. At this time, therefore, the impedance as viewed from the input/output pad 90 is substantially equal to the resistance value of the printed wiring in the board system 12 illustrated in FIG. 12, and thus the impedance is matched. When the output node of the inverter (95, 96) is caused to transition from low level to high level, the logic at the input terminal of the inverter 11 and that at the output terminal of the inverter (95, 96) become equal to each other. Therefore, the impedance as viewed from the input/output pad 90 is substantially equal to the input impedance of the inverter 11.

As mentioned above, in input signal transition, the input impedance is made substantially equal to the resistance value of the printed wiring in the board system 12 illustrated in FIG. 12, and the impedance is thereby matched. Therefore, reflected waves resulting from a signal, outputted to a transmission line, being reflected in an input circuit are reduced. On other occasions than input signal transition, the input impedance is increased, and the consumption of direct current is thereby suppressed.

As mentioned above, the inverter, formed by connecting the p-channel MOS transistor 95 and the n-channel MOS transistor 96 in series, is provided, and the multiplexer 93 is placed in the stage preceding this inverter. Signal transmission paths are changed by the multiplexer 93, and the inverter (95, 96) is thereby shared between the input portion 91 and the output portion 92. Therefore, the footprint of the input portion 91 can be reduced as compared with the constitution illustrated in FIG. 9.

Figure 11:
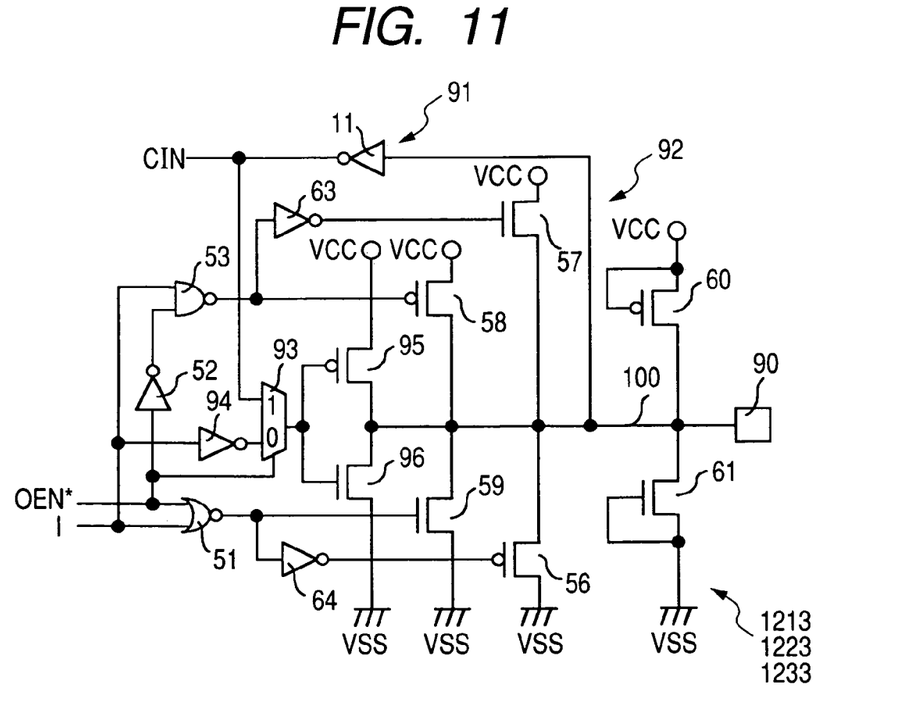
FIG. 11 is a circuit diagram illustrating another example of the constitution of the input/output circuit included in the semiconductor integrated circuit.

FIG. 11 illustrates another example of the constitution of the input/output circuits 1213, 1223, and 1233. A big difference of the input/output circuits 1213, 1223, and 1233 illustrated in FIG. 11 from those illustrated in FIG. 10 is that: an output circuit, formed by connecting a p-channel MOS transistor 58 and an n-channel MOS transistor 59 in series, is provided. The output circuit, formed by connecting the p-channel MOS transistor 58 and the n-channel MOS transistor 59 in series, has the same functions as those illustrated in FIG. 8 and FIG. 9.

The source electrode of the p-channel MOS transistor 68 is connected to higher-potential power supply VCC, and the source electrode of the n-channel MOS transistor 59 is connected to lower-potential power supply VSS. The point at which the p-channel MOS transistor 58 and the n-channel MOS transistor 59 are connected in series is connected to the input/output node 100. The operation of the p-channel MOS transistor 58 is controlled by the output signal of the NAND circuit 53, and the operation of the n-channel MOS transistor 59 is controlled by the output signal of the NOR circuit 51.

Figure 15:
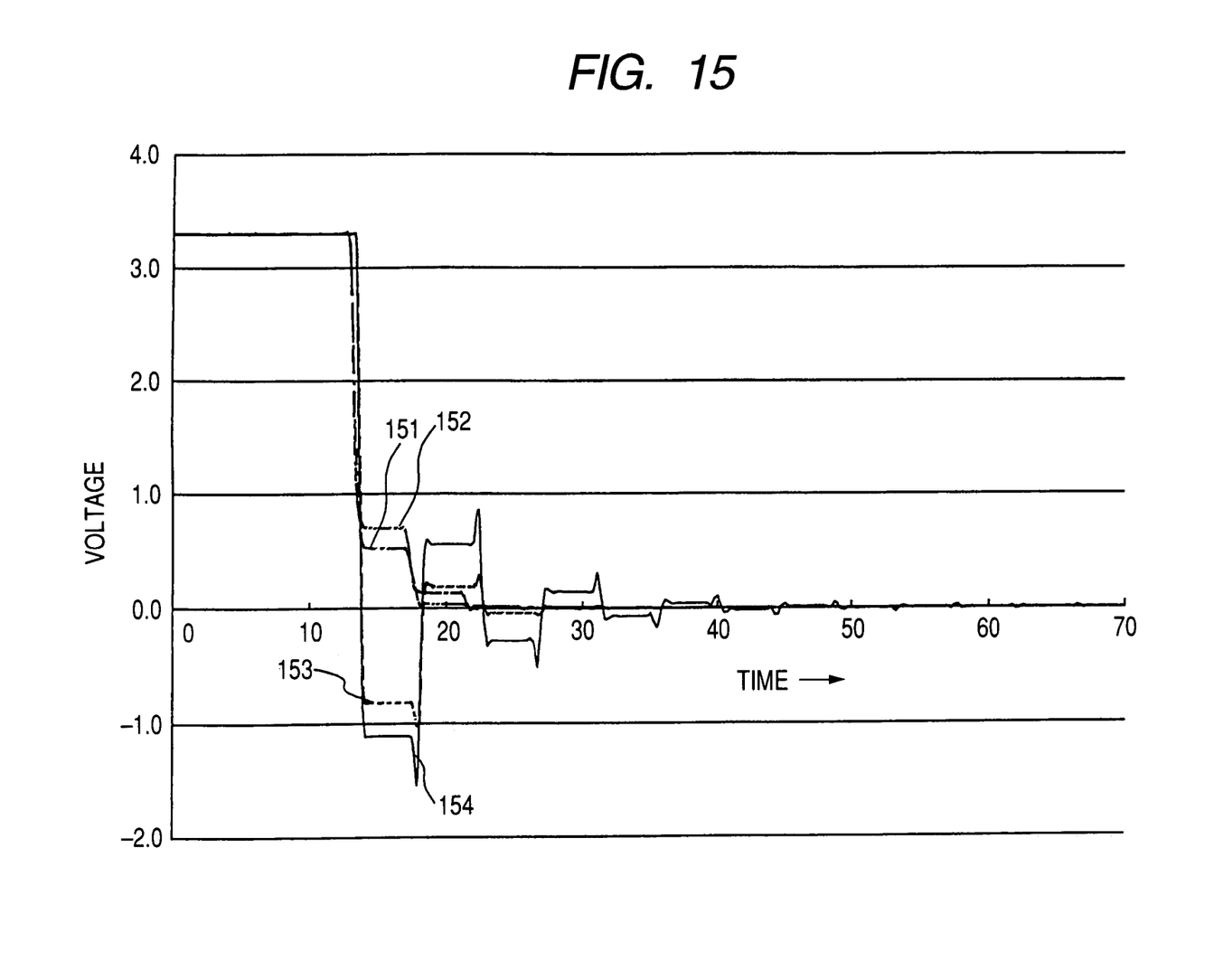
FIG. 15 is a characteristic diagram for comparison of the semiconductor integrated circuit with a conventional example.
Figure 16:
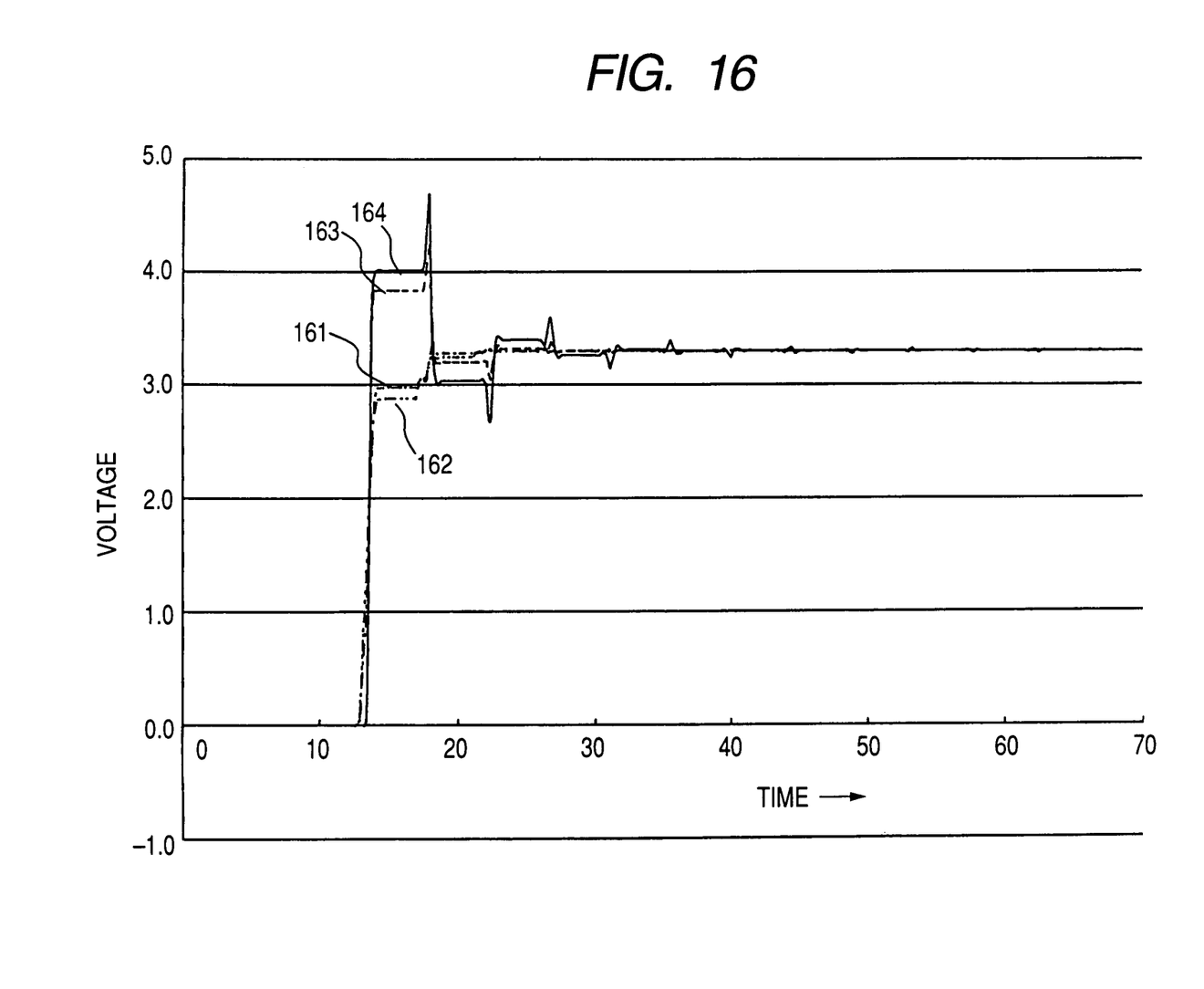
FIG. 16 is a characteristic diagram for comparison of the semiconductor integrated circuit with a conventional example.

Description will be given to the results of simulations done by the present inventors, with reference to FIG. 15 and FIG. 16. FIG. 15 is a characteristic diagram illustrating a case where transition is made from high level to low level; and FIG. 16 is a characteristic diagram illustrating a case where transition is made from low level to high level. In FIG. 15 and FIG. 16, the individual characteristic curves indicate the following: characteristic curves 151 and 161 represent a case where a signal is transmitted from the output circuit illustrated in FIG. 5 to the input circuit illustrated in FIG. 1; characteristic curves 152 and 162 represent a case where a signal is transmitted from the output circuit illustrated in FIG. 5 to an input circuit simply based on inverter. (This input circuit corresponds to what is obtained by omitting the resister 13 in FIG. 1.); characteristic curves 153 and 163 represent a case where a signal is transmitted from a conventional circuit without driving force switching to the input circuit illustrated in FIG. 1; and characteristic curves 154 and 164 represent a case where a signal is transmitted from a conventional circuit without driving force switching to an input circuit simply based on inverter. (This input circuit corresponds to what is obtained by omitting the resister 13 in FIG. 1.) As is apparent from FIG. 15 and FIG.

16, ringing is reduced by use of the input circuit illustrated in FIG. 1 or the output circuit illustrated in FIG. 5. Ringing is further reduced by use of both the input circuit illustrated in FIG. 1 and the output circuit illustrated in FIG. 5.

In the above-mentioned embodiments, the following action and effect can be obtained:

(1) The input circuits 1211, 1222, and 1232 are so set that the input impedance during input signal transition is lower than the input impedance on other occasions than input signal transition. Thus, reflected waves are reduced during input signal transition.

(2) As illustrated in FIG. 2, the inverter 15 is provided for inverting the logic of the output signal of the inverter 11, and signal CIN is transmitted to an internal circuit through the inverter 15. Thus, even if the parasitic capacitance 14 exists on the side of the output terminal of the inverter 12, it is completely separated by the presence of the inverters 12 and 15. Therefore, the internal circuit is not influenced by the parasitic capacitance 14.

(3) As illustrated in FIG. 3, the CMOS transfer gate, formed by connecting the p-channel MOS transistor 31 and the n-channel MOS transistor 32 in parallel, is placed between the resister 13 and the output terminal of the second inverter 12. Thus, the involvement of the resister 13 with circuit operation can be controlled from a dynamic termination control terminal.

(4) As illustrated in FIG. 4, the resisters 13-1 and 13-2 are provided; the CMOS transfer gate, formed by connecting the p-channel MOS transistor 31-1 and the n-channel MOS transistor 32-1 in parallel, is placed between the resister 13-1 and the output terminal of the second inverter 12; and the CMOS transfer gate, formed by connecting the p-channel MOS transistor 31-2 and the n-channel MOS transistor 32-2 in parallel, is placed between the resister 13-2 and the output terminal of the second inverter 12. Thus, the resister 13-1 and the resister 13-2 can be selectively got involved with circuit operation by dynamic terminator resistor control signals supplied from the dynamic terminator resistor control terminals RE1 and RE2. Therefore, the resister 13-1 and the resister 13-2 can be selectively got involved with circuit operation according to the environment in the board system.

(5) The output circuit is so set that the driving force during the second half of signal transition is lower than the driving force during the first half of transition, and production of reflected waves can be thereby suppressed. As the result of the above-mentioned reduction of reflected waves, the necessity for external components, such as damping resistors and terminator resistors, for impedance matching is obviated.

(6) As illustrated in FIG. 8, the n-channel MOS transistor 57, higher in driving force, is disposed on the higher-potential power supply VCC side, and the p-channel MOS transistor 56, higher in driving force, is disposed on the lower-potential power supply VSS side. Further, the inverters 63 and 64 are provided in place of the level monitor circuits 54 and 55. Thus, during the first half of the transition period, a load is driven by the MOS transistor 57 and 56, higher in driving force; during the second half of the transition period of the output node 50, the load is driven by the MOS transistors 58 and 59, lower in driving force. With this circuitry, the necessity for the level monitor circuits 54 and 55 is obviated; therefore, the number of elements can be reduced as compared with the constitution illustrated in FIG. 5.

(7) As illustrated in FIG. 10, the inverter, formed by connecting the p-channel MOS transistor 95 and the n-channel MOS transistor 96 in series, is provided, and the multiplexer 93 is placed in the stage preceding this inverter. Signal transmission paths are changed by the multiplexer 93, and the inverter (95, 96) is thereby shared between the input portion 91 and the output portion 92. Thus, the footprint of the input portion 91 can be reduced.

Up to this point, concrete description has been given the invention made by the present inventors based on embodiments. However, the present invention is not limited to these embodiments, and various changes may be made without departing from the scope of the invention.

INDUSTRIAL APPLICABILITY

The present invention is widely applicable to semiconductor integrated circuits.

The invention claimed is:

1. The semiconductor integrated circuit comprising:
   an input pad; and
   an input circuit for taking in external signals through the input pad,
   wherein the input circuit includes a dynamic terminator resistor circuit that can be adjusted so that an input impedance during an input signal transition is lower than an input impedance at times other than during the input signal transition,
   wherein the dynamic terminator resistor circuit comprises:
   a first logic circuit for inverting the logic of a signal transmitted through the input pad;
   a second logic circuit for inverting the logic of the output signal of the first logic circuit; and
   a resistor that can connect the input terminal of the first logic circuit with the output terminal of the second logic circuit.

2. The semiconductor integrated circuit comprising:
   an input pad; and
   an input circuit for taking in external signals through the input pad,
   wherein the input circuit includes a dynamic terminator resistor circuit that can be adjusted so that an input impedance during an input signal transition is lower than an input impedance at times other than during the input signal transition,
   wherein the dynamic terminator resistor circuit comprises:
   a first logic circuit for inverting the logic of a signal transmitted through the input pad;
   a second logic circuit for inverting the logic of the output signal of the first logic circuit;
   a resistor that can connect the input terminal of the first logic circuit with the output terminal of the second logic circuit; and
   a third logic circuit for transmitting the output signal of the first logic circuit to an internal circuit.

3. The semiconductor integrated circuit according to claim 1 or claim 2, including:
   a switch circuit capable of controlling the involvement of the resistor with circuit operation.

4. The semiconductor integrated circuit according to claim 1 or claim 2,
   wherein the dynamic terminator resistor circuit comprises:
   a first logic circuit for inverting the logic of a signal transmitted through the input pad;
   a second logic circuit for inverting the logic of the output signal of the first logic circuit;

a plurality of resistors that can connect the input terminal of the first logic circuit with the output terminal of the second logic circuit; and a switch circuit for selectively getting a plurality of the resistors involved with circuit operation.

5. The semiconductor integrated circuit comprising:

an internal circuit; and an output circuit that can externally output an output signal of the internal circuit, wherein the output circuit comprises;

a first output circuit that can drive an external load based on the output signal of the internal circuit during a first half of transition of a signal to be outputted; and a second output circuit whose driving force is set lower than that of the first output circuit and which can drive the external load, said semiconductor integrated circuit further including:

a level monitor circuit for selectively getting the first output control circuit or the second output circuit involved with circuit operation according to the voltage level of the external load.

6. The semiconductor integrated circuit comprising:

an internal circuit; and an output circuit that can externally output an output signal of the internal circuit, wherein the output circuit comprises:

a first output circuit that can drive an external load based on the output signal of the internal circuit during a first half of transition of a signal to be outputted; and a second output circuit whose driving force is set lower than that of the first output circuit and which can drive the external load, wherein the second output circuit includes a series connection circuit of an n-channel transistor disposed on a higher-potential power supply side and a p-channel transistor disposed on a lower-potential power supply side, and a series connection node between the n-channel transistor and the p-channel transistor is coupled to the output node of the first output circuit.

7. A semiconductor integrated circuit comprising:

an input portion so set that an input impedance during an input signal transition is lower than an input impedance at times other than during the input signal transition; and an output portion so set that a driving force during a second half of signal transition is lower than a driving force during a first half of transition, wherein the output portion comprises:

a first output circuit that can drive an external load based on the output signal of the internal circuit during the first half of transition of a signal to be outputted; and a second output circuit whose driving force is set lower than that of the first output circuit and which can drive the external load, wherein the second output circuit includes a series connection circuit of an n-channel transistor disposed on a higher-potential power supply side and a p-channel transistor disposed on a lower-potential power supply side, and wherein a series connection node between the n-channel transistor and the p-channel transistor is connected in common to the input/output pad together with the output node of the first output circuit, and the series connection circuit is also used as part of the input portion.

* * * * *